United States Patent [19]

Hatakeyama et al.

[11] Patent Number: 4,770,922
[45] Date of Patent: Sep. 13, 1988

[54] PRINTED CIRCUIT BOARD BASE MATERIAL

[75] Inventors: Minoru Hatakeyama, Sakuragaokanishi; Kosuke Moriya; Ichiro Komada, both of Okayama, all of Japan

[73] Assignee: Japan Gore-Tex, Inc., Tokyo, Japan

[21] Appl. No.: 37,418

[22] Filed: Apr. 13, 1987

[51] Int. Cl.⁴ .................. B32B 5/16; B32B 7/10; B32B 23/08
[52] U.S. Cl. .................. 428/211; 174/68.5; 428/240; 428/251; 428/268; 428/327; 428/422; 428/430; 428/435; 428/473.5; 428/480; 428/513; 428/901
[58] Field of Search .............. 428/422, 901, 327, 256, 428/268, 513, 537.5, 435, 430, 473.5, 480, 240, 211; 521/54; 427/96; 174/68.5

[56] References Cited

U.S. PATENT DOCUMENTS

| | | | |
|---|---|---|---|
| 4,379,858 | 4/1983 | Suzuki | 521/54 |
| 4,454,249 | 6/1984 | Suzuki et al. | 521/54 |
| 4,640,866 | 2/1987 | Suzuki | 428/901 X |
| 4,647,508 | 3/1987 | Gagit et al. | 428/422 X |
| 4,707,565 | 11/1987 | Kasai et al. | 428/251 X |

Primary Examiner—Thomas J. Herbert
Attorney, Agent, or Firm—Mortenson & Uebler

[57] ABSTRACT

A base material for use in making printed circuit boards is provided wherein minute fragments of expanded, porous polytetrafluoroethylene are uniformly mixed into another resin, and the mixture is compressed to form a composite board. In use, the board has an electrically conductive circuit affixed to at least one surface. The other resin may be epoxy, polyester or other similar resin. Laminates of such base board material affixed to a glass cloth or paper sheet may be prepared. The preferred fragment size range is 0.1 to 5 mm average diameter, and the preferred volume ratio of fragments to resin is 0.5 to 2.0.

11 Claims, 1 Drawing Sheet

PRINTED CIRCUIT BOARD BASE MATERIAL

BACKGROUND OF THE INVENTION

This invention relates to a printed circuit board base material, and provides a novel printed circuit board base material which allows a high signal transmission speed.

Printed circuit boards are widely used in electronic devices in the place of complicated connections and distributions of conductors. Most conventional printed circuit boards are generally formed by directly depositing conductors, i.e., components of electrical circuits, on epoxy base materials, glass-epoxy base materials, or ceramic base materials, for example.

Some other conventional printed circuit boards are formed by directly depositing the same conductors as mentioned above on flexible base materials made of polyimide resin sheets or polyester resin sheets, for example.

Recently, such high speed elements as gallium arsenide IC's have been developed. As a result, increasing transmission speed has been set as a goal for the printed circuit boards of the classes described above. Delay in the propagation time is affected by the dielectric constant of the base material used for the board. Thus, the material of the board is required to possess a low dielectric constant to permit an increase of the operating speed of the device. The conventional printed circuit boards mentioned above have fairly large dielectric constants falling on the order of 4 to 7 (at 1 MHz), and are not presently capable of satisfactorily meeting the increased speed requirements.

U.S. Pat. No. 4,379,858 discloses a melt molded foamed plastic composition of a tetrafluoroethylene-perfluoroalkyl vinyl ether copolymer resin matrix having expanded, porous polytetrafluoroethylene fragments mixed therein.

U.S. Pat. No. 4,454,249 discloses reinforced plastic compositions which comprise a fluoroplastic resin matrix selected from the group consisting of polytetrafluoroethylene, tetrafluoroethylene-perfluoroalkyl vinyl ether copolymer, tetrafluoroethylene-hexafluoropropylene copolymer, tetrafluoroethylene-ethylene copolymer, polytrifluorochloroethylene and polyvinylidene fluoride, and stretched, porous polytetrafluoroethylene resin fragments mixed thereinto.

U.S. Pat. No. 4,640,866 discloses a printed circuit board comprising at least one layer of metal firmly bonded in laminar contact with at least one layer of solid, sintered polytetrafluoroethylene (PTFE). In one embodiment, the solid PTFE layer contains fibers of porous, expanded, sintered PTFE mixed within it. In another embodiment, the solid PTFE layer is firmly bonded to the metal layer on one side and is firmly bonded on the other side to a layer of porous, expanded, sintered PTFE.

SUMMARY OF THE INVENTION

A base material for use in making printed circuit boards is provided comprising minute fragments of expanded, porous PTFE uniformly mixed into another resin and compressed to the form of a composite board. To produce a printed circuit board, an electrically conductive circuit is affixed to at least one surface of the composite board. Suitable resins include an epoxy resin, a polyimide resin, a polyester resin and a bismaleimide-triazine resin. The composite board may be laminated to a glass cloth or to a paper sheet. The average particle diameter of the fragments is preferably in the range of 0.1 to 5 mm and most preferably in the range of 0.5 to 1 mm. The volume ratio of fragments to other resin is preferably 0.5 to 2 and most preferably is 0.8 to 1.2.

DETAILED DESCRIPTION OF THE INVENTION AND PREFERRED EMBODIMENTS WITH REFERENCE TO THE DRAWINGS

A base material for use in making printed circuit boards is provided wherein minute fragments of expanded, porous polytetrafluoroethylene are uniformly mixed into another resin, and the mixture is compressed to form a composite board. In use, the board has an electrically conductive circuit affixed to at least one surface. The other resin may be epoxy, polyester or other similar resin. Laminates of such base board material affixed to a glass cloth or paper sheet may be prepared. The preferred fragment size range is 0.1 to 5 mm average diameter, and the preferred volume ratio of fragments to resin is 0.5 to 2.0.

Preparation of the material for the printed circuit board comprises comminuting a porous, expanded polytetrafluoroethylene (PTFE) material into minute fragments and admixing the minute porous fragments with epoxy resin, polyester resin, polyimide resin, bismaleimide-triazine resin or other similar resin thereby forming a composite.

Expanded PTFE, as disclosed in U.S. Pat. No. 3,953,566, owing to the comminution thereof into minute fragments, can be uniformly mixed and dispersed in other resins possessing different attributes.

Because the minute fragments possess a porous texture, they are firmly bound with the other resin enabling production of an integrally composite material for the printed circuit board.

Figure 1:
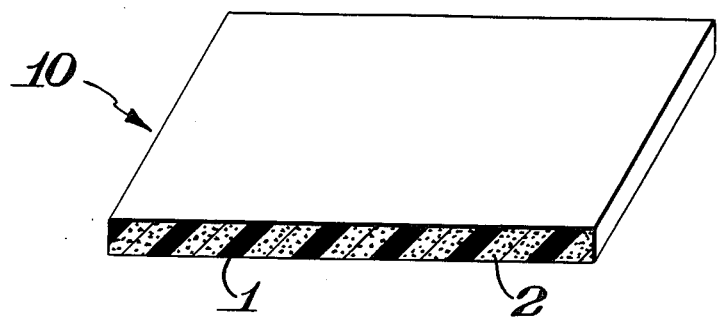
FIG. 1 is a perspective cross-sectional view of a printed circuit board base material according to the invention.

In the drawings, FIG. 1 shows a perspective cross-sectional view of a printed circuit board base wherein 1 is a compressed epoxy or other resin sheet having minute fragments 2 of porous, expanded PTFE mixed therein.

Figure 2:
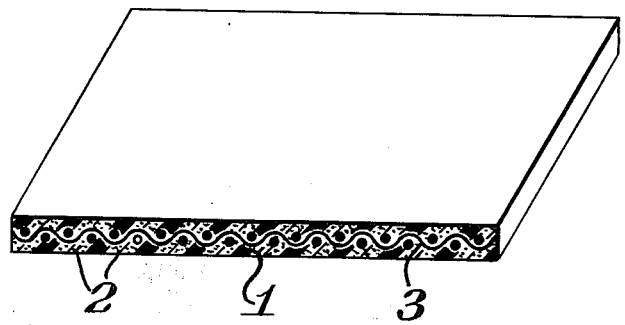
FIG. 2 is a perspective cross-sectional view of a printed circuit board base material according to the invention laminated to glass cloth.

FIG. 2 shows the material of FIG. 1 laminated to a glass cloth 3.

A typical working example of this invention will be described below with reference to the accompanying drawings. Minute fragments 2 of a porous, expanded polytetrafluoroethylene material are admixed with epoxy resin, polyester resin, polyimide resin, bismaleimide-triazine resin or other similar resin 1 to produce a composite. This composite is molded in the shape of a sheet or plate 10. Optionally, this basic structure may be combined by virtue of impregnation with a glass cloth 3 or with a paper-like sheet as illustrated in FIG. 2. By the combination through impregnation with the glass cloth 3, for example, the board to be finally produced from the basic structure is enabled to exhibit dimensional stability at the time of fabrication thereof.

The minute fragments 2 of the porous, expanded polytetrafluoroethylene material are preferably formed having a particle diameter selected approximately in the range of 0.1 to 5 mm, preferably 0.5 to 1.0 mm, in due consideration of the size of the board desired to be obtained and other factors. The amount of the minute fragments 2 to be admixed with the other resin is preferably such that the volumetric ratio of the minute fragments to the other resin will fall in the range of 0.5 to 2, preferably 0.8 to 1.2.

EXAMPLE

Minute fragments of porous, expanded polytetrafluoroethylene material produced having particle diameters of 0.5 to 1.0 mm were admixed with epoxy resin in a volumetric ratio of 1:1. The resulting mixture was molded into the shape of a plate 1.6 mm in thickness. The plate was left aging to cure the epoxy resin contained therein, to complete a product.

The base board thus obtained was found by measurement to possess a dielectric constant of 3.33, a value considerably lower than the typical dielectric constant, 4.5, of a conventional base board. It has been confirmed that this base board, when used in the production of printed circuits for various electronic devices utilizing the above-mentioned super-high-speed elements, will improve their transmission speed.

As described above, in accordance with the present invention, porous, expanded polytetrafluoroethylene resin can be effectively distributed, despite differences in melting point and other factors, into epoxy, polyester or other similar resin when the polytetrafluoroethylene resin is prepared as a porous material and then comminuted into minute fragments of the prescribed particle diameter. Owing to the mixture of the polytetrafluoroethylene with epoxy resin, for example, the material for the printed circuit board has a lowered dielectric constant and can be used for fabrication of electric circuits fully utilizing the characteristics of modern, ultra-high speed elements. This invention, therefore, has a high economic worth.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A base material for use in making printed circuit boards comprising minute fragments of expanded, porous PTFE uniformly mixed into another resin and compressed to the form of a composite board, wherein said compressed composite board has an electrically conductive circuit affixed to at least one surface thereof.

2. The composite board of claim 1 laminated to a paper sheet.

3. The composite board of claim 1 wherein said other resin is an epoxy resin.

4. The composite board of claim 1 wherein said other resin is polyimide resin.

5. The composite board of claim 1 wherein said other resin is a polyester resin.

6. The composite board of claim 1 wherein said other resin is a bismaleimide-triazine resin.

7. The composite board of claim 1 laminated to a glass cloth.

8. The composite board of claim 1 wherein the particle diameter of said fragments is in the range of 0.1 to 5 mm.

9. The composite board of claim 1 wherein the particle diameter of said fragments is in the range of 0.5 to 1 mm.

10. The composite board of claim 1 wherein the volume ratio of fragments to said other resin is 0.5 to 2.

11. The composite board of claim 1 wherein the volume ratio of fragments to said other resin is 0.8 to 1.2.

* * * * *